US012575331B2

(12) United States Patent
Jeong et al.

(10) Patent No.: US 12,575,331 B2
(45) Date of Patent: Mar. 10, 2026

(54) MAGNETIC TUNNEL JUNCTION AND MAGNETIC MEMORY DEVICE WITH AMORPHOUS METAL BORIDE AND DIFFUSION BARRIER

(71) Applicant: Samsung Electronics Co., Ltd., Suwon-si (KR)

(72) Inventors: Junho Jeong, Hwaseong-si (KR); Joonmyoung Lee, Gwacheon-si (KR); Whankyun Kim, Seoul (KR); Eunsun Noh, Yongin-si (KR); Jeongheon Park, Hwaseong-si (KR); Wanjin Chung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 852 days.

(21) Appl. No.: 17/212,790

(22) Filed: Mar. 25, 2021

(65) Prior Publication Data

US 2022/0037586 A1 Feb. 3, 2022

(30) Foreign Application Priority Data

Jul. 28, 2020 (KR) ........................ 10-2020-0093853

(51) Int. Cl.
    *H10N 50/80* (2023.01)
    *G11C 11/16* (2006.01)
    (Continued)

(52) U.S. Cl.
    CPC ........... *H10N 50/80* (2023.02); *G11C 11/161* (2013.01); *H01F 10/3286* (2013.01);
    (Continued)

(58) Field of Classification Search
    CPC .............. G11C 11/161; G11C 11/1695; H01F 10/3286; H01F 10/30; H10B 61/22;
    (Continued)

(56) References Cited

U.S. PATENT DOCUMENTS 9,425,387 B1 *  8/2016  Liu ........................ H10N 50/10
9,954,164 B2     4/2018  Jeong et al.
    (Continued)

FOREIGN PATENT DOCUMENTS

CN          106688118 A  *  5/2017  ............. H01L 43/08
KR    10-2017-0039127 A     4/2017
    (Continued)

OTHER PUBLICATIONS

Office Action dated Jul. 21, 2024 for corresponding KR Patent Application No. 10-2020-0093853.

*Primary Examiner* — William B Partridge
*Assistant Examiner* — David Paul Sedorook
(74) *Attorney, Agent, or Firm* — Muir Patent Law, PLLC

(57) ABSTRACT

Provided is a magnetic memory device. The magnetic memory device may include a magnetic tunnel junction. The magnetic tunnel junction may include a fixed layer, a tunnel barrier layer on the fixed layer, a free layer on the tunnel barrier layer, a protection layer above the free layer, the protection layer comprising an amorphous metal boride, and a capping layer on the protection layer, the capping layer comprising a metal or a metal nitride.

19 Claims, 6 Drawing Sheets

100

(51) Int. Cl.
    *H01F 10/32*         (2006.01)
    *H10B 61/00*         (2023.01)
    *H10N 50/85*         (2023.01)
(52) U.S. Cl.
    CPC ............. *H10B 61/22* (2023.02); *H10N 50/85*
        (2023.02); *G11C 11/1659* (2013.01)
(58) Field of Classification Search
    CPC ......... H10N 50/10; H01L 43/02; H01L 43/08;
               H01L 43/10; H01L 27/228
    See application file for complete search history.

(56)            References Cited

U.S. PATENT DOCUMENTS

| | | | |
|---|---|---|---|
| 10,003,011 B2 | 6/2018 | Park et al. | |
| 10,431,275 B2 | 10/2019 | Jung et al. | |
| 10,431,736 B2 | 10/2019 | Liu et al. | |
| 2009/0046397 A1* | 2/2009 | Sun | H01F 41/302 |
| | | | 360/324.11 |
| 2011/0076514 A1* | 3/2011 | Kurata | B82Y 10/00 |
| | | | 428/800 |
| 2012/0164487 A1* | 6/2012 | Childress | G11B 5/1278 |
| | | | 360/110 |
| 2013/0001715 A1* | 1/2013 | Yamakawa | H10N 50/85 |
| | | | 257/E29.323 |
| 2014/0131649 A1* | 5/2014 | Daibou | H10N 50/85 |
| | | | 257/2 |
| 2017/0200884 A1 | 7/2017 | Oguz et al. | |
| 2018/0006215 A1* | 1/2018 | Jeong | H10N 50/01 |
| 2019/0019944 A1* | 1/2019 | Sato | G11C 11/1695 |
| 2019/0097124 A1 | 3/2019 | Lee et al. | |
| 2019/0140166 A1* | 5/2019 | Rahman | G11C 11/161 |
| 2020/0005845 A1* | 1/2020 | Gupta | H10N 50/01 |
| 2020/0006425 A1* | 1/2020 | Lin | H10N 50/01 |
| 2020/0251650 A1* | 8/2020 | Kim | H10B 61/22 |
| 2020/0266333 A1* | 8/2020 | Park | H10N 50/01 |
| 2021/0057641 A1* | 2/2021 | Nishioka | H10B 61/00 |

FOREIGN PATENT DOCUMENTS

| | | |
|---|---|---|
| KR | 10-2017-0093546 A | 8/2017 |
| KR | 10-2019-0134738 A | 12/2019 |
| WO | 2016/022107 A1 | 2/2016 |

* cited by examiner

MAGNETIC TUNNEL JUNCTION AND MAGNETIC MEMORY DEVICE WITH AMORPHOUS METAL BORIDE AND DIFFUSION BARRIER

CROSS-REFERENCE TO RELATED APPLICATION

This application is based on and claims priority under 35 U.S.C. § 119 to Korean Patent Application No. 10-2020-0093853, filed on Jul. 28, 2020, in the Korean Intellectual Property Office, the disclosure of which is incorporated by reference herein in its entirety.

BACKGROUND

The inventive concept relates to a memory device. More particularly, the inventive concept relates to a magnetic memory device including a magnetic tunnel junction.

In accordance with demands for electronic devices of high speed and low power consumption, there have been increasing demands for memory devices of high speed and low power consumption being included in electronic devices. A magnetic memory device has been suggested as a memory device for fulfilling the demands. A magnetic memory device may include a magnetic tunnel junction.

SUMMARY

The inventive concept is aimed at providing a magnetic memory device capable of preventing or inhibiting deviations between characteristics of memory cells caused due to a high-temperature process.

A magnetic memory device according to an embodiment of the inventive concept includes a magnetic tunnel junction. The magnetic tunnel junction includes a fixed layer, a tunnel barrier layer on the fixed layer, a free layer on the tunnel barrier layer, a protection layer above the free layer, the protection layer comprising an amorphous metal boride, and a capping layer on the protection layer, the capping layer comprising a metal or a metal nitride.

A magnetic memory device according to an embodiment of the inventive concept includes a magnetic tunnel junction. The magnetic tunnel junction includes a fixed layer, a tunnel barrier layer on the fixed layer, a free layer on the tunnel barrier layer, a metal oxide layer on the free layer, the metal oxide layer including first metal atoms, a diffusion barrier layer on the metal oxide layer, a metal boride layer being on the diffusion barrier layer, the metal boride layer including second metal atoms, and a capping layer being on the metal boride layer, the capping layer including third metal atoms.

A magnetic memory device according to an embodiment of the inventive concept includes a magnetic tunnel junction. The magnetic tunnel junction includes a fixed layer, a tunnel barrier layer, a free layer, a protection layer, and a capping layer that are stacked in a vertical direction, wherein the protection layer is configured to inhibit diffusion of atoms from the capping layer to the free layer when a temperature of the magnetic tunnel junction increases and to inhibit a change in the crystallinity of the free layer caused due to the capping layer when the temperature of the magnetic tunnel junction increases.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
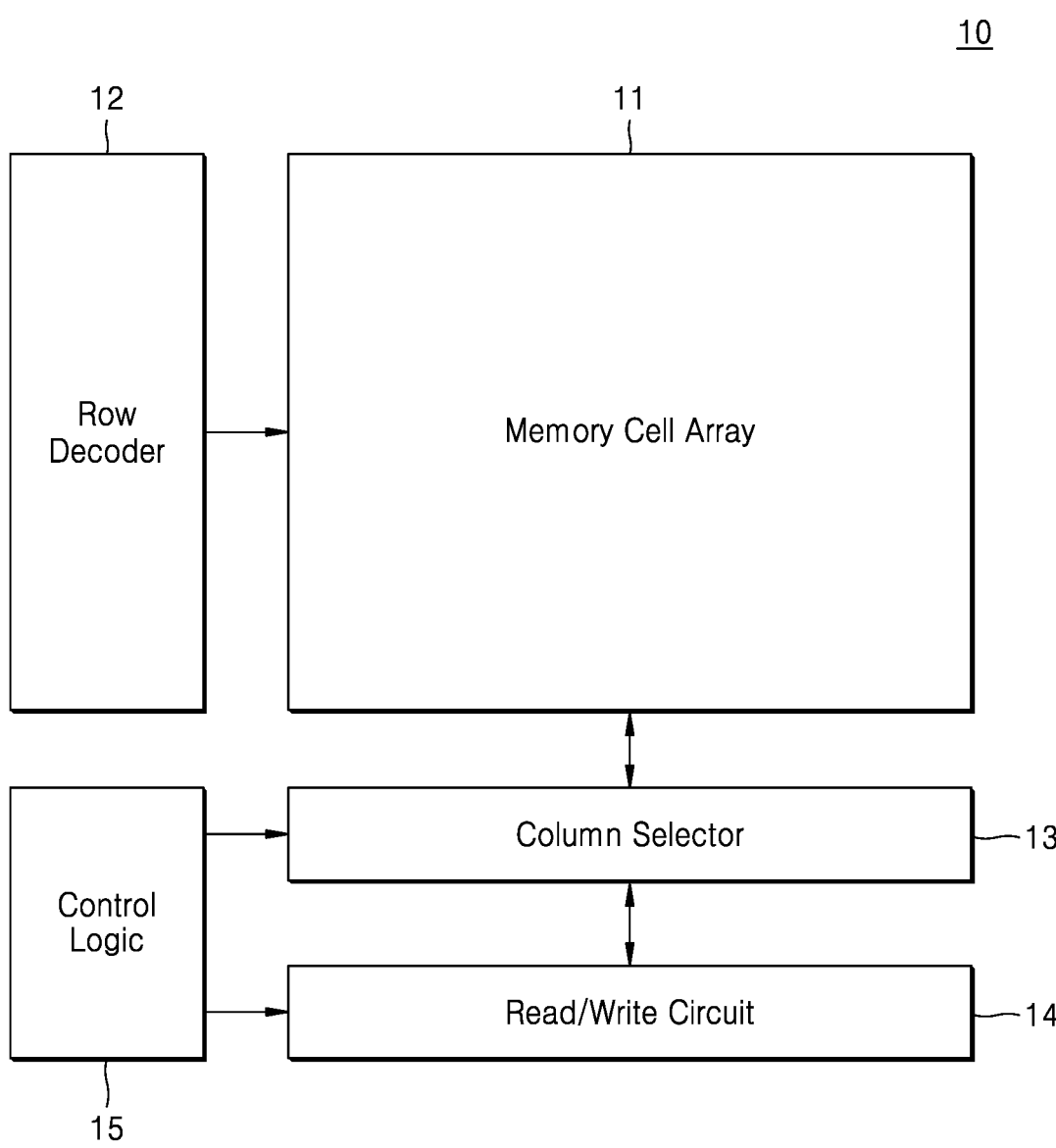
FIG. 1 is a block diagram of a magnetic memory device according to an embodiment of the inventive concept.

FIG. 1 is a block diagram of a magnetic memory device 10 according to an embodiment of the inventive concept.

Referring to FIG. 1, the magnetic memory device may include a memory cell array 11, a row decoder 12, a column selector 13, a read/write circuit 14, and a control logic 15.

Figure 2:
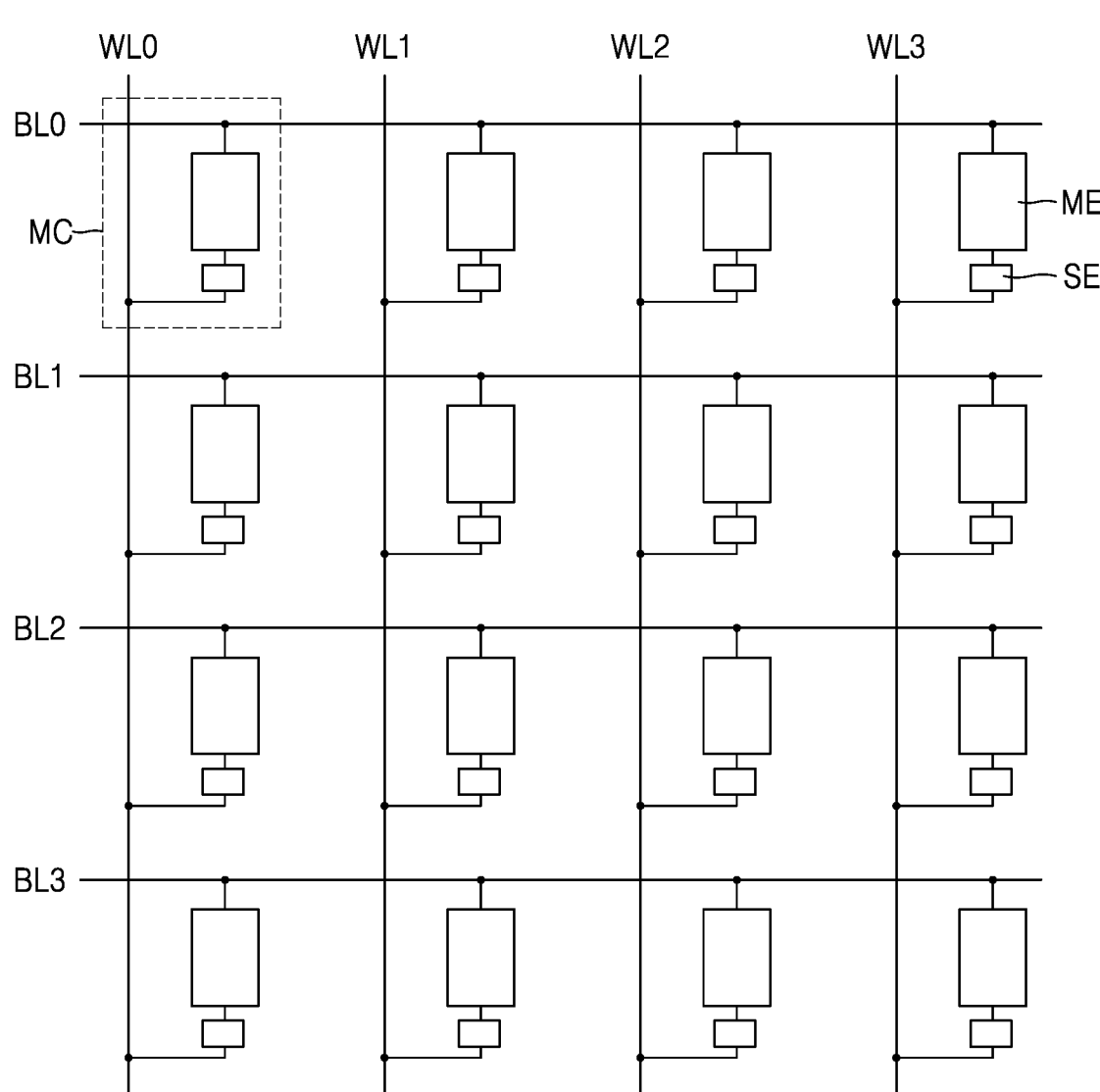
FIG. 2 is a circuit diagram of a memory cell array included in a magnetic memory device according to an embodiment of the inventive concept.
Figure 3:
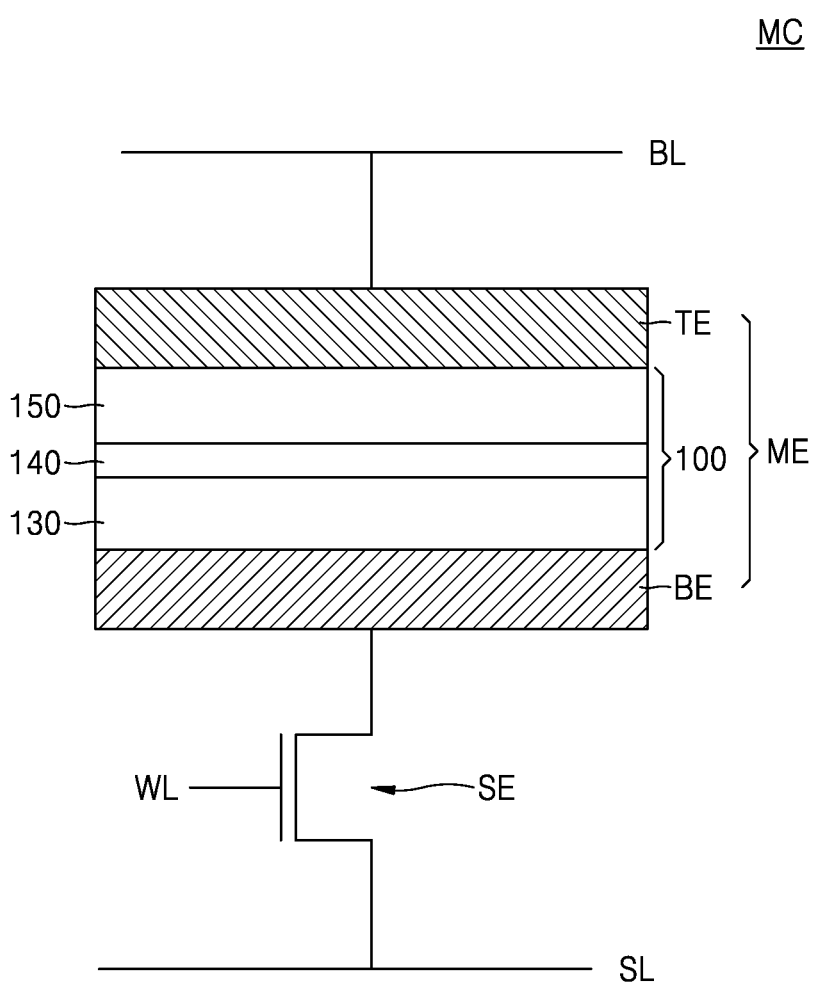
FIG. 3 is a schematic diagram of a memory cell included in a magnetic memory device according to an embodiment of the inventive concept.

The memory cell array 11 may include a plurality of memory cells MC (see FIGS. 2 and 3). The memory cell array 11 will be described in detail later with reference to FIG. 2.

The row decoder 12 may be electrically connected to the memory cell array 11 through a plurality of word lines WL0 through WL3 (see FIG. 2). The row decoder 12 may select at least one of the plurality of word lines WL0 through WL3 (see FIG. 2) by decoding an address input from the outside.

The column selector 13 may be electrically connected to the memory cell array 11 through a plurality of bit lines BL0 through BL3 (see FIG. 2). The column selector 13 may select at least one of the plurality of bit lines BL0 through BL3 (see FIG. 2) by decoding the address input from the outside. The bit line selected by the column selector 13 may be electrically connected to the read/write circuit 14.

As used herein, components described as being "electrically connected" are configured such that an electrical signal can be transferred from one component to the other (although such electrical signal may be attenuated in strength as it transferred and may be selectively transferred). Moreover, components that are "directly electrically connected" share a common electrical node through electrical connections by one or more conductors, such as, for example, wires, pads, internal electrical lines, through vias, etc. As such, directly electrically connected components do not include components electrically connected through active elements, such as transistors or diodes.

The read/write circuit 14 may provide a bit line voltage to the bit line selected by the column selector 13 to write data, which is input, to the memory cell array 11 or read data stored in the memory cell.

The control logic 15 may generate control signals for controlling the magnetic memory device 10 in response to a command signal provided from the outside. The read/write circuit 14 may be controlled by the control signals. In some embodiments, the row decoder 12 and the column selector 13 may be further controlled by the control signals.

FIG. 2 is a circuit diagram of the memory cell array 11 included in the magnetic memory device 10 (see FIG. 1) according to an embodiment of the inventive concept.

Referring to FIG. 2, the memory cell array 11 may include the plurality of memory cells MC. The plurality of memory cells MC may be electrically connected to the plurality of word lines WL0 through WL3 and the plurality of bit lines BL0 through BL3. Each of the plurality of memory cells MC may be electrically connected between one of the plurality of word lines WL0 through WL3 and one of the plurality of bit lines BL0 through BL3. The plurality of memory cells MC respectively electrically connected to the bit lines BL0 through BL3 may be respectively electrically connected to the plurality of word lines WL0 through WL3. The plurality of memory cells MC respectively electrically connected to the word lines WL0 through WL3 may be respectively electrically connected to the plurality of bit lines BL0 through BL3. Accordingly, one memory cell MC may be selected by selecting one of the plurality of word lines WL0 through WL3 and one of the plurality of bit lines BL0 through BL3.

Each of the plurality of memory cells MC may include a memory unit ME and a switching unit SE. The memory unit ME may include a variable resistance unit that may be switched into one of two resistance states by electrical signals applied to the memory unit ME. The switch unit SE may be configured to selectively control flow of an electric charge flowing through the memory unit SE. For example, the switching unit SE may include a field effect transistor, a diode, or a bipolar transistor. The memory cell MC will be described later in further detail with reference to FIG. 3.

FIG. 3 is a schematic diagram of the memory cell MC included in the magnetic memory device 10 (see FIG. 1) according to an embodiment of the inventive concept.

Referring to FIG. 3, the memory cell MC may include the memory unit ME and the switching unit SE. The memory unit ME may include a magnetic tunnel junction 100. In some embodiments, the memory unit ME may further include a bottom electrode BE below the magnetic tunnel junction 100 and a top electrode TE on the magnetic tunnel junction 100. For example, the magnetic tunnel junction 100 may be between the bottom electrode BE and the top electrode TE.

Figure 5:
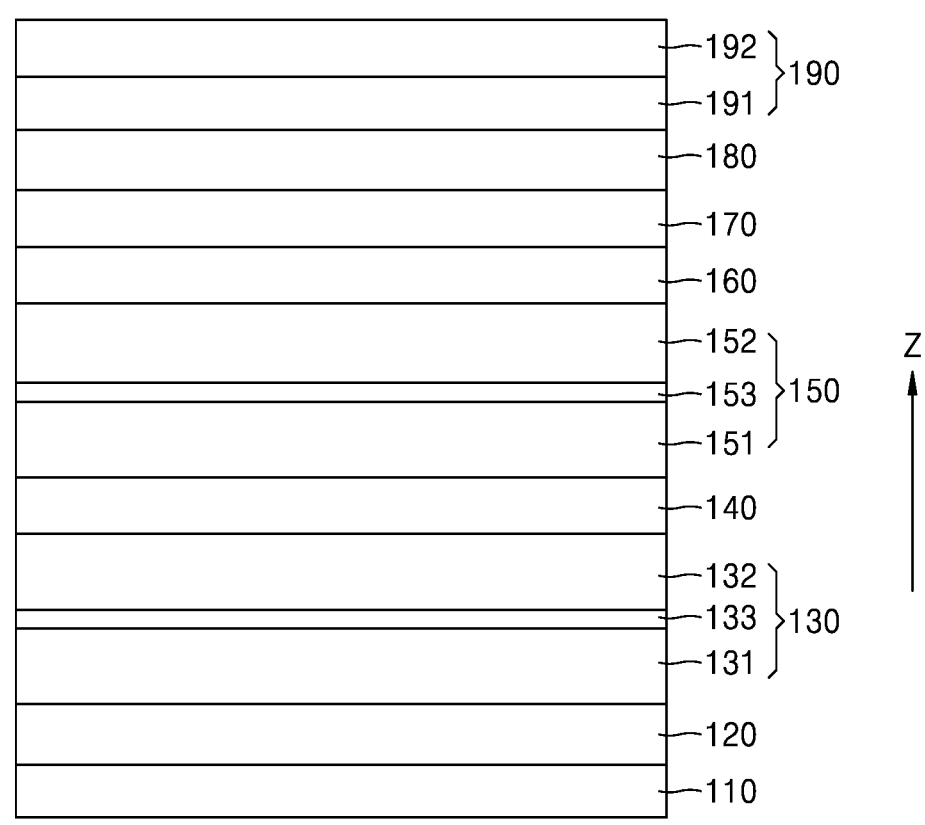
FIG. 5 is a cross-sectional view of a magnetic tunnel junction included in a magnetic memory device according to an embodiment of the inventive concept.

The magnetic tunnel junction 100 may include a fixed layer 130, a free layer 150, and a tunnel barrier layer 140 between the fixed layer 130 and the free layer 150. As shown in FIG. 5, the magnetic tunnel junction 100 may include a larger number of layers than the three layers 130, 140 and 150, and the fixed layer 130 and the free layer 150 may each include a plurality of layers. However, for convenience of explanation, the magnetic tunnel junction 100 is only schematically shown in FIG. 3. Details of the configuration of the magnetic tunnel junction 100 will be further described later with reference to FIG. 5.

The fixed layer 130 may have a fixed magnetization direction, while the free layer 150 may have a variable magnetization direction. For example, the magnetization direction of the free layer 150 may vary by predetermined voltages applied to opposite ends (surfaces) of the free layer 150. When the magnetization directions of the fixed layer 130 and the free layer 150 are oriented in parallel, the possibility that electrons are tunneled through the tunnel barrier layer 140 increases, and thus, the magnetic tunnel junction 100 may be in a low resistance state. On the contrary, when the magnetization directions of the fixed layer 130 and the free layer 150 are oriented in opposite directions, the possibility that the electrons are tunneled through the tunnel barrier layer 140 decreases, and thus, the magnetic tunnel junction 100 may be in a high resistance state. Consequently, the magnetic tunnel junction 100 may be switched between two electric resistance states, e.g., the low resistance state and the high resistance state. Due to this characteristic, the magnetic tunnel junctions 100 may be used to store data.

In some embodiments, the switching unit SE may include a field effect transistor. In some embodiments, a source line SL may be electrically connected to a first source/drain of the switching unit SE, and the magnetic tunnel junction 100 may be electrically connected to a second source/drain of the switching unit SE through the bottom electrode BE. A word line WL may be electrically connected to a gate of the switching unit SE. The magnetic tunnel junction 100 may be electrically connected to the source line SL through the bottom electrode BE and the switching unit SE and electrically connected to the bit line BL through the top electrode TE. In some embodiments, the bit line BL and the source line SL may be interchanged with each other. For example, the magnetic tunnel junction 100 may be electrically connected to the bit line BL through the bottom electrode BE and the switching unit SE and electrically connected to the source line SL through the top electrode TE. The magnetic tunnel junction 100 may be selectively receive electrical signal from the source line SL by turning on/off the switching unit SE by controlling a voltage of the word line WL.

Figure 4:
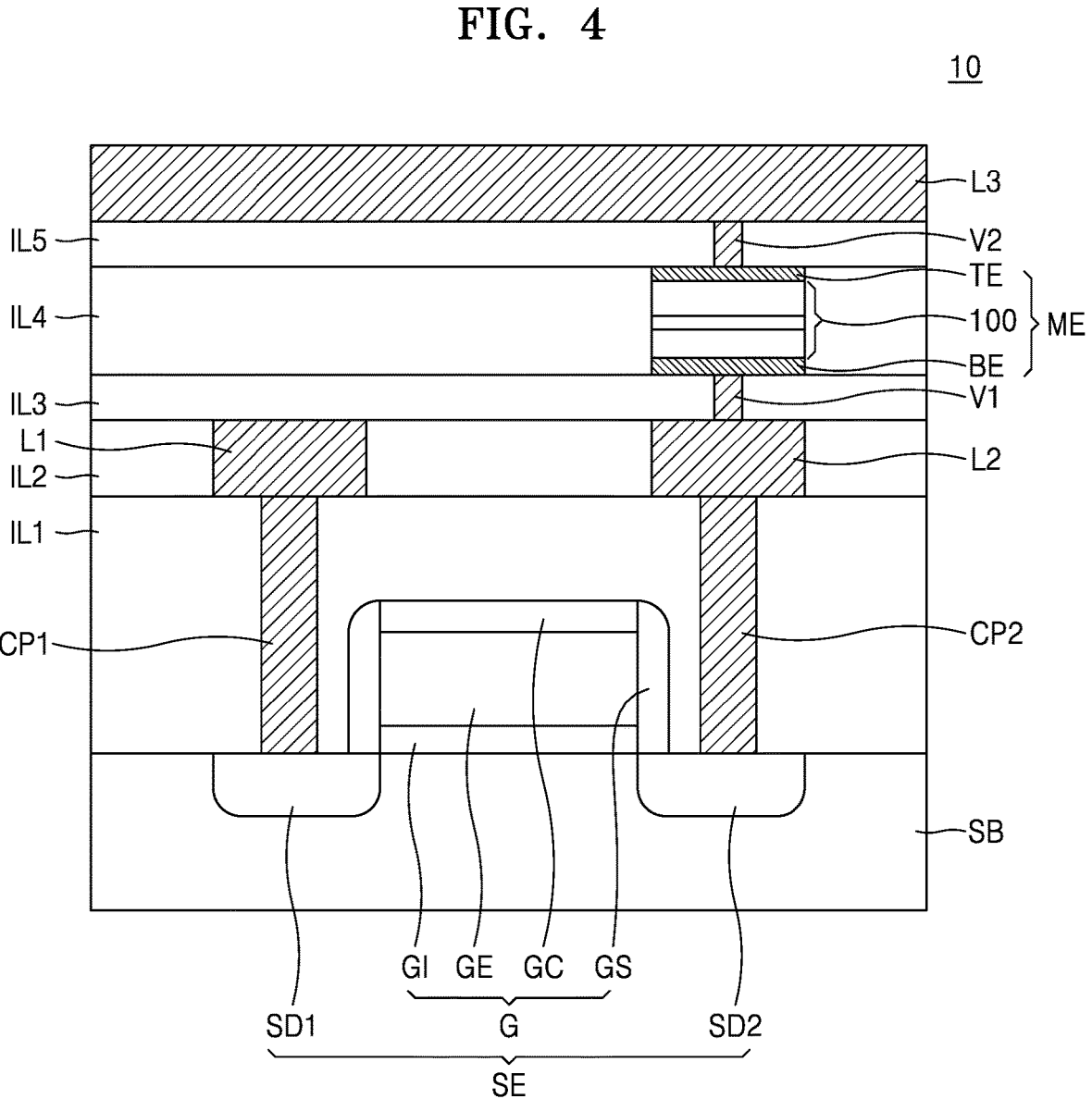
FIG. 4 is a cross-sectional view of a magnetic memory device according to an embodiment of the inventive concept.

FIG. 4 is a cross-sectional view of the magnetic memory device 10 according to an embodiment of the inventive concept.

Referring to FIG. 4, the magnetic memory device 10 may include a substrate SB, the switching unit SE on the substrate SB, and the magnetic tunnel junction 100 electrically connected to the switching unit SE.

The substrate SB may include or may be formed of a semiconductor material such as a Group IV semiconductor material, a Group III-V semiconductor material, or a Group II-VI semiconductor material. The Group IV semiconductor material may include, for example, silicon (Si), germanium (Ge), or Si—Ge. The Group III-V semiconductor material may include, for example, gallium arsenide (GaAs), indium phosphide (InP), gallium phosphide (GaP), indium arsenide (InAs), indium stibium (InSb), or InGaAs. The Group II-IV semiconductor material may include, for example, zinc telluride (ZnTe) or cadmium sulfide (CdS). The substrate SB may be a bulk wafer or an epitaxial layer. For example, the epitaxial layer may be an epitaxial wafer or an epitaxial layer formed on a substrate. For example, the substrate SB may be a semiconductor wafer or a substrate including an epitaxial layer formed on an upper portion of the substrate.

The switching unit SE may include a gate structure G formed on the substrate SB, and a first source/drain structure SD1 and a second source/drain structure SD2 respectively adjacent to two sides of the gate structure G. The gate structure G may include a gate insulating layer GI, a gate electrode layer GE, and a gate capping layer GC that are stacked on the substrate SB. The gate structure G may further include gate spacer layers GS on lateral surfaces of the gate insulating layer GI, the gate electrode layer GE, and the gate capping layer GC.

In some embodiments, the gate insulating layer GI may include or may be formed of an interface layer on the substrate SB and a high dielectric layer on the interface layer. The interface layer may include or may be formed of a low dielectric material having a dielectric constant of about 9 or lower, for example, $SiO_2$, SiN, or a combination thereof. The interface layer may be omitted in certain embodiments. The high dielectric layer may include or may be formed of a material having a dielectric constant greater than that of $SiO_2$, for example, a material having a dielectric constant from about 10 to about 25. The high dielectric layer may include or may be formed of, for example, hafnium dioxide ($HfO_2$), zirconium dioxide ($ZrO_2$), aluminum oxide ($Al_2O_3$), or a combination thereof.

The gate electrode layer GE may include or may be formed of a metal, a metal nitride, a metal carbide, or a combination thereof. The metal may include or may be titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), palladium (Pd), or a combination thereof. The metal nitride may include or may be titanium nitride (TiN), tantalum nitride (TaN), or a combination thereof. The metal carbide may include or may be titanium aluminum carbide (TiAlC).

The gate capping layer GC may include or may be formed of, for example, SiN. The gate spacer layer GS may include or may be formed of, for example, $SiO_2$, SiN, or a combination thereof.

Each of the first source/drain structure SD1 and the second source/drain structure SD2 may include or may be formed of a semiconductor material such as a Group IV semiconductor material, a Group III-V semiconductor material or Group II-VI semiconductor material. The Group IV semiconductor material may include, for example, Si, Ge, or Si—Ge. The Group III-V semiconductor material may include, for example, GaAs, InP, GaP, InAs, InSb, or InGaAs. The Group II-VI semiconductor material may include, for example, ZnTe or CdS. For example, each of the first source/drain structure SD1 and the second source/drain structure SD2 may include SiGe layers respectively having different concentrations and a Si capping layer.

In some embodiments, the magnetic memory device 10 may further include a first interlayer insulating layer IL1 covering the substrate SB and the switching unit SE. The first interlayer insulating layer IL1 may include or may be formed of, for example, $SiO_2$, SiN, or a combination thereof. The magnetic memory device 10 may further include a first conductive line L1 and a second conductive line L2 on the first interlayer insulating layer ILL The magnetic memory device 10 may further include a first contact plug CP1, which electrically connects the first conductive line L1 to the first source/drain structure SD1 and penetrates the first interlayer insulating layer ILL and a second contact plug CP2, which electrically connects the second conductive line L2 to the second source/drain structure SD2 and penetrates the first interlayer insulating layer ILL The first conductive line L1 may correspond to the source line SL shown in FIG. 3 or may be electrically connected to the source line SL. For example, the first conductive line L1 may be a source line SL. The first conductive line L1, the second conductive line L2, the first contact plug CP1, and the second contact plug CP2 may each include or be formed of a metal and a metal barrier layer. The metal may include or may be W, Ti, tantalum (Ta), aluminum (Al), copper (Cu), silver (Ag), gold (Au), or a combination thereof. The metal barrier layer may include or may be formed of Ti, Ta, TiN, TaN, or a combination thereof.

In some embodiments, the magnetic memory device 10 may further include a second interlayer insulating layer IL2 on the first interlayer insulating layer IL1 and surrounding a lateral surface of the first conductive line L1 and a lateral surface of the second conductive line L2. The magnetic memory device 10 may further include a third interlayer insulating layer IL3 on the second interlayer insulating layer IL2. The second interlayer insulating layer IL2 and the third interlayer insulating layer IL3 may each include or be formed of $SiO_2$, SiN, or a combination thereof.

The memory unit ME may be arranged on the third interlayer insulating layer IL3. The bottom electrode BE and the top electrode TE may each include or be formed of a metal, a metal nitride, or a combination thereof. For example, the bottom electrode BE and the top electrode TE may each include or be formed of Ta, Ru, TaN, or a combination thereof. Details regarding the magnetic tunnel junction 100 will be further described later with reference to FIG. 5.

In some embodiments, the magnetic memory device 10 may further include a first via V1 penetrating the third interlayer insulating layer IL3 and electrically connecting the bottom electrode BE to the second conductive line L2. The first via V1 may include or may be formed of a metal and a metal barrier layer. The metal may include or may be W, Ti, Ta, Al, Cu, Ag, Au, or a combination thereof. The metal barrier layer may include or may be formed of Ti, Ta, TiN, TaN, or a combination thereof.

In some embodiments, the magnetic memory device 10 may further include a fourth interlayer insulating layer IL4 on the third interlayer insulating layer IL3 and surrounding the memory unit ME, e.g., in a plan view. In some embodiments, the magnetic memory device 10 may further include a fifth interlayer insulating layer IL5 on the fourth interlayer insulating layer IL4. The fourth interlayer insulating layer IL4 and the fifth interlayer insulating layer IL5 may each include or be formed of $SiO_2$, SiN, or a combination thereof.

In some embodiments, the magnetic memory device 10 may further include a third conductive line L3 on the fifth interlayer insulating layer IL5. The third conductive line L3 may correspond to the bit line BL shown in FIG. 3 or may be electrically connected to the bit line BL shown in FIG. 3. For example, the third conductive line L3 may be a bit line BL. In some embodiments, the magnetic memory device 10 may further include a second via V2 electrically connecting the third conductive line L3 to the top electrode TE and penetrating the fifth interlayer insulating layer IL5. The third conductive line L3 and the second via V2 may each include or be formed of a metal and a metal barrier layer. The metal may include or may be W, Ti, Ta, Al, Cu, Ag, Au, or a combination thereof. The metal barrier layer may include or may be formed of Ti, Ta, TiN, TaN, or a combination thereof.

FIG. 5 is a cross-sectional view of the magnetic tunnel junction 100 included in the magnetic memory device 10 (see FIG. 2) according to an embodiment of the inventive concept.

Referring to FIG. 5, the magnetic tunnel junction 100 may include the fixed layer 130, the tunnel barrier layer 140, the free layer 150, a protection layer 180, and a capping layer 190 that are stacked in a vertical direction (the Z direction). For example, the magnetic tunnel junction 100 may include the fixed layer 130, the tunnel barrier layer 140 on the fixed layer 130, the free layer 150 on the tunnel barrier layer 140, the protection layer 180 above the free layer 150, and the capping layer 190 on the protection layer 180.

In some embodiments, the magnetic tunnel junction 100 may further include a perpendicular magnetic anisotropy reinforcement layer 160 between the free layer 150 and the protection layer 180. In some embodiments, the magnetic tunnel junction 100 may further include a diffusion barrier layer 170 between the perpendicular magnetic anisotropy reinforcement layer 160 and the protection layer 180. In some embodiments, the magnetic tunnel junction 100 may further include a seed layer 120 below the fixed layer 130.

In some embodiments, the magnetic tunnel junction 100 may further include a buffer layer 110 below the seed layer 120.

The buffer layer 110 may be configured to prevent or inhibit the crystallinity of the bottom electrode BE (see FIGS. 1 and 2) from affecting the crystallinity of the layers formed on the buffer layer 110, for example, the seed layer 120, the fixed layer 130, the tunnel barrier layer 140, and the free layer 150. For example, the buffer layer 110 may prevent or inhibit (e.g., hinder) an influence of the crystallinity of the bottom electrode BE on the crystallinity of the layers formed above the buffer layer 110. In some embodiments, the buffer layer 110 may be amorphous. The buffer layer 110 may be non-magnetic or magnetic. In some embodiments, the buffer layer 110 may include or may be formed of a compound or a composition represented by a form of XY, wherein X may include or may be iron (Fe), Co, or a combination thereof, and Y may include or may be Hf, Yttrium (Y), zirconium (Zr), or a combination thereof.

The seed layer 120 may be configured to help the fixed layer 130, the tunnel barrier 140, and the free layer 150 have desirable crystal structures. In some embodiments, the seed layer 120 may have a hexagonal close-packed (HCP) structure. In other embodiments, the seed layer 120 may be amorphous. The seed layer 120 may be non-magnetic or magnetic. The seed layer 120 may include or may be formed of nichrome (NiCr), cobalt-iron-boron (CoFeB), magnesium (Mg), Ta, Ru, or a combination thereof.

The fixed layer 130 may have a fixed magnetization direction. The fixed magnetization direction may be a vertically upward direction (the Z direction) or a vertically downward direction (the −Z direction).

In some embodiment, the fixed layer 130 may include a first fixed layer 131 on the seed layer 120, an anti-parallel coupling layer 133 on the first fixed layer 131, and a second fixed layer 132 on the anti-parallel coupling layer 133. The first fixed layer 131 may be a hard bias stack/layer. The second fixed layer 132 may be a reference layer. For example, the magnetization direction of the reference layer may be referenced to determine the magnetization direction of the free layer 150.

Each of the first fixed layer 131 and the second fixed layer 132 may be crystalline. Each of the first fixed layer 131 and the second fixed layer 132 may be ferromagnetic. Each of the first fixed layer 131 and the second fixed layer 132 may have a fixed magnetization direction. A magnetization direction of the second fixed layer 132 may be opposite to a magnetization direction of the first fixed layer 131. For example, the magnetization direction of the first fixed layer 131 may be the vertically upward direction (the Z direction), and the magnetization direction of the second fixed layer 132 may be the vertically downward direction (the −Z direction). Each of the first fixed layer 131 and the second fixed layer 132 may include or may be formed of Co, Pt, CoFeB, FeB, CoB, Fe, cobalt-iron-aluminum (CeFeAl), manganese aluminum (MnAl), or a combination thereof.

The anti-parallel coupling layer 133 may help the magnetization direction of the first fixed layer 131 and the magnetization direction of the second fixed layer 132 become/maintain anti-parallel. The anti-parallel coupling layer 133 may include or may be formed of, for example, Ru, Ir, or a combination thereof. The anti-parallel coupling layer 133 may be a synthetic antiferromagnetic (SAF) layer.

The tunnel barrier layer 140 may be crystalline or amorphous. The tunnel barrier layer 140 may be non-magnetic or magnetic. The tunnel barrier layer 140 may separate the fixed layer 130 from the free layer 150. The tunnel barrier layer 140 may include or may be formed of $Al_2O_3$, MgO, magnesium aluminum oxide (MgAlO), $HfO_2$, $ZrO_2$, zinc peroxide ($ZnO_2$), titanium dioxide ($TiO_2$), or a combination thereof. In some embodiments, the tunnel barrier layer 140 may include a plurality of layers. For example, the tunnel barrier layer 140 may have a stack structure having layers such as Mg/MgO, MgO/Mg, MgO/MgAlO, MgAlO/MgO, Mg/MgAlO/Mg, MgO/MgAlO/MgO, MgAlO/MgO, MgAlO, and the like.

The free layer 150 may be ferromagnetic. The magnetization direction of the free layer 150 may be changed into the vertically upward direction (the Z direction) or the vertically downward direction (the −Z direction). The free layer 150 may have a magnetization direction that is parallel or anti-parallel to the magnetization direction of the fixed layer 130. The free layer 150 may be crystalline. The free layer 150 may include or may be formed of Co, Fe, CoB, FeB, CoFe, CoFeB, CoO, FeO, CoFeO, or a combination thereof.

In some embodiments, the free layer 150 may include a first free layer 151, a second free layer 152 on the first free layer, and an inserted layer 153 between the first free layer 151 and the second free layer 152. Each of the first free layer 151 and the second free layer 152 may be ferromagnetic. Each of the first free layer 151 and the second free layer 152 may include or may be formed of Co, Fe, CoB, FeB, CoFe, CoFeB, CoO, FeO, CoFeO, or a combination thereof.

When each of the first free layer 151 and the second free layer 152 includes boron atoms, the inserted layer 153 may pull the boron atoms such that the boron atoms in the first free layer 151 and the second free layer 152 do not escape from the free layer 150. Therefore, the inserted layer 153 may include a material having an affinity for boron atoms that is higher than an affinity for boron atoms of metal atoms in the first free layer 151 and the second free layer 152. The inserted layer 153 may include or may be formed of, for example, Mo, W, Ta, Hf, CoFeMo, Mg, or a combination thereof. A thickness of the inserted layer 153 may be about 1 nm or less.

The perpendicular magnetic anisotropy reinforcement layer 160 may help the magnetization direction of the free layer 150 be parallel to the vertically upward direction Z or the vertically downward direction Z. The perpendicular magnetic anisotropy reinforcement layer 160 may include or may be formed of a metal oxide, and thus, may be a metal oxide layer. The metal in the metal oxide may include or may be, for example, Ta, Mg, Hf, Nb, Zr, Al, Mn, W, Mo, Co, Fe, Ru, or a combination thereof. The perpendicular magnetic anisotropy reinforcement layer 160 may be non-magnetic or magnetic. The perpendicular magnetic anisotropy reinforcement layer 160 may be crystalline or amorphous.

The capping layer 190 may be configured to protect the magnetic tunnel junction 100 in the following processes after the magnetic tunnel junction 100 is manufactured. The capping layer 190 may include or may be formed of a metal or a metal nitride. The metal may include or may be Ru and/or Ta. The metal nitride may include or may be TiN, TaN, aluminum nitride (AlN), zirconium nitride (ZrN), niobium nitride (NbN), molybdenum nitride (MoN), or a combination thereof. In some embodiments, the capping layer 190 may include a plurality of layers. For example, the capping layer 190 may include a first capping layer 191 and a second capping layer 192 on the first capping layer 191, the first capping layer 191 including Ru, and the second capping layer 192 including Ta. The capping layer 190 may be magnetic or non-magnetic. The capping layer 190 may be crystalline or amorphous. In some embodiments, the capping layer 190 may have an HCP structure.

The protection layer 180 may prevent or inhibit (e.g., hinder) diffusion of atoms from the capping layer 190, for example, metal atoms, to the free layer 150 when a temperature of the magnetic tunnel junction 100 increases, for example, up to 400° C. or higher. To prevent or inhibit the diffusion of the metal atoms, the protection layer 180 may include or may be formed of a metal boride. For example, the protection layer 180 including the metal boride may be a metal boride layer. Boron (B) may be advantageous for preventing or inhibit diffusion of the metal atoms. The metal of the metal boride may include or may be Ta, Mg, Al, Hf, Zr, Ti, Mn, Nb, Fe, Co, W, or a combination thereof. A concentration of boron in the metal boride may be from about 5 at % to about 40 at %. When the concentration of boron is equal to or greater than 5 at %, the metal boride may be amorphous. As the concentration of boron increases, an amorphous characteristic of the metal boride may also increase. However, when the concentration of boron is equal to or greater than 40 at %, the amorphous characteristic of the metal boride may cause difficulty in manufacturing a metal boride sputter target for forming the metal boride layer.

The protection layer 180 may protect the crystal structure of the free layer 150 by preventing or inhibiting (e.g., hindering) transition of the crystal structure of the capping layer 190 to the free layer 150 when the temperature of the magnetic tunnel junction 100 increases, for example, up to 400° C. or higher. To prevent or inhibit transition of the crystal structure, the protection layer 180 may be amorphous. For example, the protection layer 180 may be an amorphous metal boride layer including or formed of an amorphous metal boride. In another embodiment, the protection layer 180 may include or may be formed of a crystalline metal boride. The protection layer 180 may be non-magnetic or magnetic. A thickness (a dimension in the vertical direction (the Z direction)) of the protection layer 180 may be about 10 Å.

The diffusion barrier layer 170 may prevent or inhibit diffusion of the atoms from the perpendicular magnetic anisotropy reinforcement layer 160 to the diffusion barrier layer 170 when the temperature of the magnetic tunnel junction 100 increases, for example, up to 400° C. or higher. For example, the diffusion barrier layer 170 may be configured to prevent or inhibit diffusion of oxygen atoms in the metal oxide from the perpendicular magnetic anisotropy reinforcement layer 160 to/above the diffusion barrier layer 170. To prevent or inhibit diffusion of the oxygen atoms, the diffusion barrier layer 170 may include metal atoms having an affinity for the oxygen atoms that is less than an affinity for oxygen atoms of the metal atoms in the metal oxide in the perpendicular magnetic anisotropy reinforcement layer 160.

The diffusion barrier layer 170 may prevent or inhibit diffusion of the atoms from the protection layer 180 into the perpendicular magnetic anisotropy reinforcement layer 160 when the temperature of the magnetic tunnel junction 100 increases, for example, up to 400° C. or higher. For example, the diffusion barrier layer 170 may be configured to prevent or inhibit diffusion of the boron atoms in the metal boride in the protection layer 180. To prevent or inhibit diffusion of the boron atoms, the diffusion barrier layer 170 may include metal atoms having an affinity for boron atoms that is less than an affinity for boron atoms of the metal atoms in the metal boride in the protection layer 180.

The diffusion barrier layer 170 may include or may be formed of a metal or a metal nitride. The diffusion barrier layer 170 may be crystalline or amorphous. When the diffusion barrier layer 170 has an HPC structure, the crystal structure of the diffusion layer 170 may affect a crystal structure of the free layer 150, and therefore, the diffusion barrier layer 170 may not have the HPC structure. The diffusion barrier layer 170 may have, for example, a body-centered cubic (BCC) structure or a face-centered cubic (FCC) structure, or may be amorphous.

According to embodiments of the inventive concept, the protection layer 180 may prevent or inhibit diffusion of the atoms from the capping layer 190 to the free layer 150 when the temperature of the magnetic tunnel junction 100 increases, and may prevent or inhibit change in the crystal structure of the free layer 150, which may be caused due to the crystal structure of the capping layer 190, when the temperature of the magnetic tunnel junction 100 increases. Accordingly, the protection layer 180 may prevent or inhibit deviation of characteristics of the memory cell, especially a switching characteristic, which may be caused due to increase in concentrations of impurities and change in the crystal structure in the free layer 150 due to the high-temperature process. The diffusion barrier layer 170 may prevent or inhibit diffusion of the atoms between the perpendicular magnetic anisotropy reinforcement layer 160 and the protection layer 180 at a high temperature. Accordingly, the diffusion barrier layer 170 may prevent or inhibit deviation of the characteristics of the memory cell, especially the switching characteristic, which may be caused due to the high-temperature process. The high-temperature process may include, for example, a process of forming the inter-layer insulating layer IL4 or IL5 (see FIG. 4), a hydrogen annealing process of a transistor, and the like.

Figure 6:
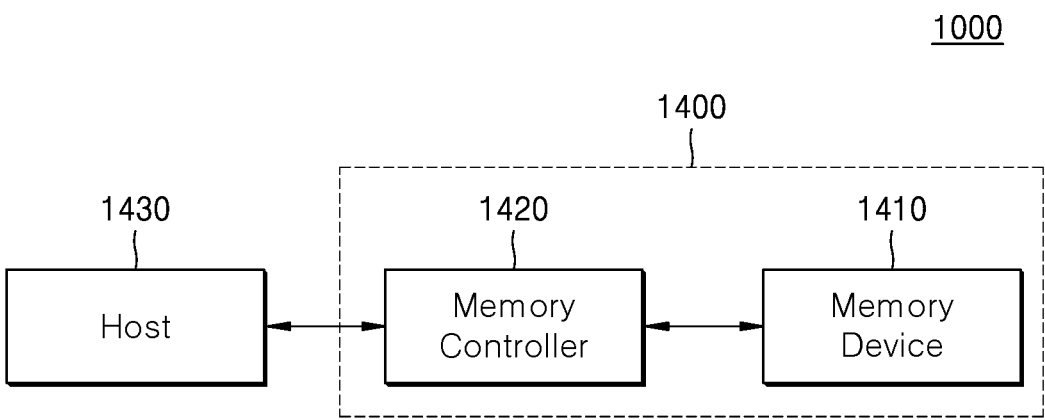
FIG. 6 is a block diagram of an electronic device according to an embodiment of the inventive concept.

FIG. 6 is a block diagram of an electronic device 1000 according to an embodiment of the inventive concept.

Referring to FIG. 6, the electronic device 1000 may include a memory system 1400. The memory system 1400 may include a memory device 1410 and a memory controller 1420. The memory controller 1420 may control the memory device 1410 to read stored data from the memory device 1410 or write data to the memory device 1410 in response to a read/write request of a host 1430. The memory controller 1420 may construct an address mapping table for mapping an address provided from the host 1430, for example, a mobile apparatus or a computer system, to a physical address of the memory device 1410. The memory device 1410 may include the magnetic memory device 10 described with reference to FIGS. 1 through 4 and/or the magnetic memory device 10 including the magnetic tunnel junction 100 described with reference to FIG. 5. In some embodiments, the electronic device 1000 may include a notebook, a computer, a tablet, a mobile phone, a wearable electronic device, or an Internet of Things electronic product.

While the inventive concept has been particularly shown and described with reference to embodiments thereof, it will be understood that various changes in form and details may be made therein without departing from the spirit and scope of the following claims.

What is claimed is:

1. A magnetic memory device comprising a magnetic tunnel junction, wherein the magnetic tunnel junction comprises:
  a fixed layer;
  a tunnel barrier layer on the fixed layer;
  a free layer on the tunnel barrier layer;

a diffusion barrier layer on the free layer, the diffusion barrier layer formed of a metal or metal nitride;

a protection layer above the diffusion barrier layer, the protection layer comprising an amorphous metal boride, the protection layer being non-magnetic; and a capping layer on the protection layer, the capping layer comprising a metal or a metal nitride, wherein the free layer has a first crystal structure, and wherein the capping layer has a second crystal structure that is different from the first crystal structure.

2. The magnetic memory device of claim 1, wherein a boron concentration in the protection layer is from about 5 at % to about 40 at %.

3. The magnetic memory device of claim 1, further comprising a perpendicular magnetic anisotropy reinforcement layer between the free layer and the protection layer, the perpendicular magnetic anisotropy reinforcement layer comprising a metal oxide.

4. The magnetic memory device of claim 3, wherein the diffusion barrier layer is in physical contact with the perpendicular magnetic anisotropy reinforcement layer.

5. The magnetic memory device of claim 4, wherein the diffusion barrier layer consists essentially of a metal or a metal nitride.

6. A magnetic memory device comprising a magnetic tunnel junction, wherein the magnetic tunnel junction comprises:

a fixed layer;

a tunnel barrier layer on the fixed layer;

a free layer on the tunnel barrier layer;

a metal oxide layer on the free layer, the metal oxide layer comprising first metal atoms;

a diffusion barrier layer consisting essentially of a metal or metal nitride on the metal oxide layer and physically contacting the metal oxide layer;

an amorphous metal boride layer on the diffusion barrier layer, the amorphous metal boride layer being non-magnetic and comprising second metal atoms; and a capping layer on the amorphous metal boride layer, the capping layer comprising third metal atoms, wherein the free layer has a first crystal structure, and wherein the capping layer has a second crystal structure that is different from the first crystal structure.

7. The magnetic memory device of claim 6, wherein the diffusion barrier layer comprises atoms having an affinity for oxygen atoms that is less than an affinity for oxygen atoms of the first metal atoms.

8. The magnetic memory device of claim 6, wherein the diffusion barrier layer comprises atoms having an affinity for boron atoms that is less than an affinity for boron atoms of the second metal atoms.

9. The magnetic memory device of claim 6, wherein the diffusion barrier layer does not have a hexagonal close-packed (HCP) crystal structure.

10. The magnetic memory device of claim 6, wherein the first metal atoms comprise tantalum (Ta), magnesium (Mg), hafnium (Hf), niobium (Nb), zirconium (Zr), titanium (Ti), aluminum (Al), manganese (Mn), cobalt (Co), iron (Fe), ruthenium (Ru), or a combination thereof.

11. The magnetic memory device of claim 6, wherein the second metal atoms comprise tantalum (Ta), magnesium (Mg), aluminum (Al), hafnium (Hf), zirconium (Zr), titanium (Ti), manganese (Mn), niobium (Nb), iron (Fe), cobalt (Co), tungsten (W), or a combination thereof.

12. The magnetic memory device of claim 6, wherein the third metal atoms comprise ruthenium (Ru), titanium (Ti), tantalum (Ta), aluminum (Al), zirconium (Zr), niobium (Nb), molybdenum (Mo), or a combination thereof.

13. A magnetic memory device comprising a magnetic tunnel junction, comprising:

a fixed layer, a tunnel barrier layer, a free layer, a perpendicular magnetic anisotropy reinforcement layer, a diffusion barrier layer, a protection layer, and a capping layer that are stacked in that order in a vertical direction, wherein the free layer has a first crystal structure and the capping layer has a second crystal structure that is different from the first crystal structure, wherein the protection layer is configured to inhibit diffusion of atoms from the capping layer to the free layer when a temperature of the magnetic tunnel junction increases and inhibit a change in crystallinity of the free layer from the first crystal structure caused due to the capping layer when the temperature of the magnetic tunnel junction increases, wherein the perpendicular magnetic anisotropy reinforcement layer is formed of a metal oxide, wherein the diffusion barrier layer is formed of a metal or metal nitride, and wherein the protection layer comprises amorphous metal boride and is non-magnetic.

14. The magnetic memory device of claim 13, wherein the atoms in the capping layer are metal atoms.

15. The magnetic memory device of claim 13, wherein the perpendicular magnetic anisotropy reinforcement layer is configured to help a magnetization direction of the free layer be parallel or anti-parallel to the vertical direction.

16. The magnetic memory device of claim 15, wherein the diffusion barrier layer is configured to perform at least one of the following:

inhibiting diffusion of atoms from the protection layer into the perpendicular magnetic anisotropy reinforcement layer when a temperature of the magnetic tunnel junction increases; and inhibiting diffusion of atoms from the perpendicular magnetic anisotropy reinforcement layer into the protection layer when the temperature of the magnetic tunnel junction increases.

17. The magnetic memory device of claim 1, wherein the first crystal structure of the free layer is a body-centered cubic (BCC) structure or a face-centered cubic (FCC).

18. The magnetic memory device of claim 6, wherein the first crystal structure of the free layer is a body-centered cubic (BCC) structure or a face-centered cubic (FCC).

19. The magnetic memory device of claim 13, wherein the first crystal structure of the free layer is a body-centered cubic (BCC) structure or a face-centered cubic FCC).

* * * * *